(12) United States Patent
Park

(10) Patent No.: US 7,569,908 B2
(45) Date of Patent: Aug. 4, 2009

(54) SEMICONDUCTOR DEVICE AND METHOD OF MANUFACTURING THE SAME

(75) Inventor: Sang-hoon Park, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 78 days.

(21) Appl. No.: 11/703,244

(22) Filed: Feb. 7, 2007

(65) Prior Publication Data

US 2007/0181971 A1    Aug. 9, 2007

(30) Foreign Application Priority Data

Feb. 8, 2006    (KR)    ............... 10-2006-0012193

(51) Int. Cl.
*H01L 27/02*    (2006.01)
*H01L 21/02*    (2006.01)

(52) U.S. Cl. ............... 257/531; 257/277; 257/758; 257/E27.009; 257/E21.022

(58) Field of Classification Search ............... 257/277, 257/531, 758, E21.022, E27.009
See application file for complete search history.

(56) References Cited

U.S. PATENT DOCUMENTS 7,468,545 B2 * 12/2008 Lin et al. ............... 257/622

| 2003/0222295 | A1 | 12/2003 | Lin | |
|---|---|---|---|---|
| 2006/0170072 | A1* | 8/2006 | Nakashiba | 257/531 |
| 2006/0263727 | A1* | 11/2006 | Lee et al. | 430/311 |
| 2006/0267198 | A1* | 11/2006 | Lin et al. | 257/750 |
| 2007/0170591 | A1* | 7/2007 | Yamanoue et al. | 257/758 |

FOREIGN PATENT DOCUMENTS

| JP | 11-176639 | 7/1999 |
|---|---|---|
| KR | 100248517 | 12/1999 |
| KR | 10-2003-0052491 | 6/2003 |
| KR | 10-2004-0080539 | 9/2004 |

OTHER PUBLICATIONS

Korean Patent Office Action for corresponding Korean patent application dated Aug. 27, 2007.

* cited by examiner

*Primary Examiner*—Victor A Mandala
(74) *Attorney, Agent, or Firm*—Harness, Dickey & Pierce

(57) ABSTRACT

A semiconductor device including inductors with improved reliability and a method of manufacturing the same are provided. The semiconductor device may include a substrate, an insulating film pattern formed on the substrate and having an opening, an amorphous metal nitride film formed inside the opening, a diffusion reducing or preventing film formed on the amorphous metal nitride film, and a conductive film including the diffusion reducing or preventing film filling the inside of the opening.

14 Claims, 5 Drawing Sheets

SEMICONDUCTOR DEVICE AND METHOD OF MANUFACTURING THE SAME

PRIORITY STATEMENT

This application claims priority under 35 USC § 119 to Korean Patent Application No. 2006-0012193, filed on Feb. 8, 2006, in the Korean Intellectual Property Office (KIPO), the entire contents of which are herein incorporated by reference.

BACKGROUND

1. Field

Example embodiments relate to a semiconductor device including inductors having improved performance and a method of manufacturing the same.

2. Description of the Related Art

A SOC (system on a chip), also known as system LSI (Large Scale Integrated circuit) or system IC (Integrated Circuit), is a semiconductor device that may be formed by integrating a system usually formed on a PCB (Printed Circuit Board) on a semiconductor. For example, a SOC used for communication may include a microprocessor, DSP, RAM, and/or ROM. When such a SOC is used, the system decreases in size and the assembling process may be simplified in comparison to that of conventional semiconductor devices.

A SOC may be formed by manufacturing a conventional semiconductor element and a RF element as a semiconductor device. A mixed signal circuit used in RF band may be formed on a silicon-based semiconductor substrate and may include basic passive elements (e.g., a resistor, capacitor, inductor, etc).

An inductor that occupies the largest area among the passive elements may require higher performance (e.g., higher performance in a Q factor (quality factor) that may determine inductance and energy storing capacity). The higher the Q factor, the greater the likelihood that the frequency characteristics of a voltage controlled oscillator and band pass filter may be stabilized and a loss may be reduced. The fore-mentioned inductance may depend on the length of a metal wire in the inductor and the Q factor may depend on the resistance of a metal.

In the related art, however, an upper most metal wire may be used as an inductor in a RF CMOS process or a general logic process. Depending on the particular process (RF CMOS process or general logic process), a metal wire may have a limitation of elongation or thickening. As such, it may be difficult to improve the performance of the inductor due to high resistance.

SUMMARY

Example embodiments provide a semiconductor device including inductors having improved performance. Example embodiments also provide a method of manufacturing a semiconductor device including inductors having improved performance.

A semiconductor device according to example embodiments may include a semiconductor substrate, a multilayered wiring structure on the semiconductor substrate, a passivation film covering the uppermost layer of the multilayered wiring structure, a first polyimide film on the passivation film, and an inductor in the passivation film and the first polyimide film.

A method of manufacturing a semiconductor device according to example embodiments may include forming a multilayered wiring structure on a semiconductor substrate, forming a passivation film and first polyimide film covering the uppermost layer of the multilayered wiring structure in sequence, and forming an inductor in the passivation film and the first polyimide film.

BRIEF DESCRIPTION OF THE DRAWINGS

Example embodiments will be more clearly understood from the following detailed description taken in conjunction with the accompanying drawings. FIGS. 1-6 represent non-limiting, example embodiments as described herein.

FIG. 1 is a cross-sectional view of a semiconductor element according to example embodiments;

FIG. 2 is a cross-sectional view of a semiconductor element according to example embodiments;

FIG. 3 is a cross-sectional view of a semiconductor device according to example embodiments;

FIG. 6 is a cross-sectional view illustrating a manufacturing method of the semiconductor device illustrated in FIG. 3.

DETAILED DESCRIPTION OF EXAMPLE EMBODIMENTS

Figure 1:
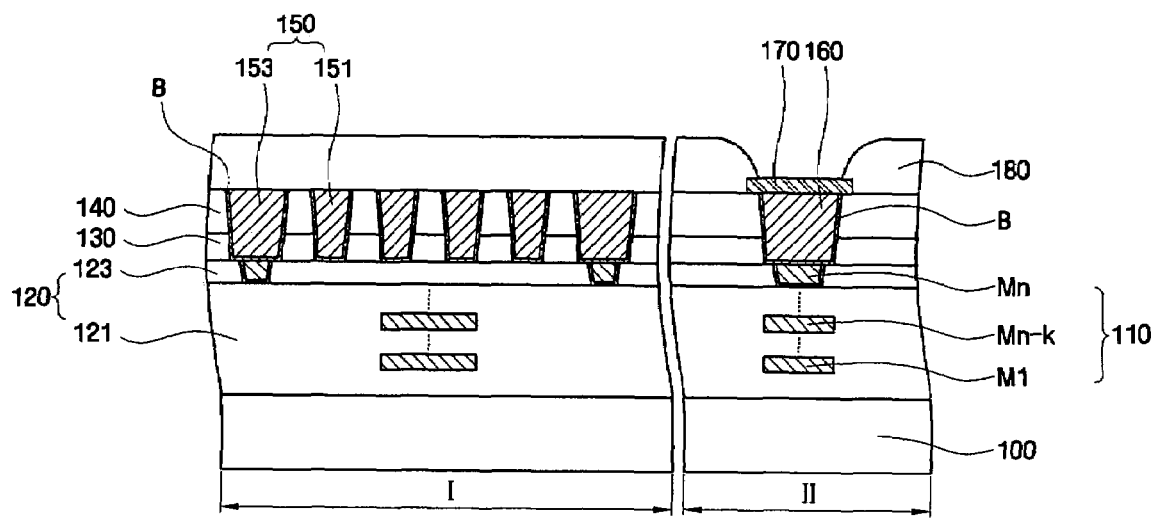

Reference will now be made in detail to example embodiments, examples of which are illustrated in the accompanying drawings. However, example embodiments are not limited to the embodiments illustrated hereinafter, and the embodiments herein are rather introduced to provide easy and complete understanding of the scope and spirit of example embodiments. In the drawings, the thicknesses of layers and regions are exaggerated for clarity.

It will be understood that when an element or layer is referred to as being "on," "connected to" or "coupled to" another element or layer, it may be directly on, connected or coupled to the other element or layer or intervening elements or layers may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a cross-sectional view of a semiconductor device according to example embodiments. Referring to FIG. 1, a semiconductor device according to example embodiments may include a multilayered wiring structure 110 on a semiconductor substrate 100.

The semiconductor substrate 100 may include an inductor-forming region I and a pad-forming region II. The semiconductor substrate 100 may be a substrate formed of at least one semiconductor material selected from a group consisting of, for example, Si, Ge, SiGe, GaAs, SiC, SiGeC, InAs, InP, and SOI (Silicon On Insulator).

The multilayered wiring structure 110 may be a structure connected to predetermined or given active elements (not shown) and passive elements, and may be formed in and/or on an interlayer insulating film 120.

In FIG. 1, 'M1' and 'Mn' represent each wiring layer in the multilayered wiring structure. 'Mn' represents the uppermost metal layer of the multilayered wiring structure 110, where 'n' is an integer larger than 'k'. Further, the reference numeral 121 represents the interlayer insulating film and reference numeral 123 represents the uppermost interlayer film. In this configuration, the multilayered wiring structure 110 including the uppermost metal layer Mn may be formed of at least one metal selected from a group including, but not limited to, silver, copper, aluminum, and an alloy.

A passivation film 130 may be formed to protect lower elements from the environment (e.g., moisture, pressure, etc.) and may cover the uppermost wiring layer Mn of the multilayered wiring structure 110.

The passivation film 130 may be formed of, but not limited to, a single film (e.g., a silicon oxide film, silicon nitride film, silicon oxynitride film, PSG (phosphor silicate glass), polyimide film, or a composite film). The thickness of the passivation film 130 may be in the range of approximately 3000 to 10000 Å.

A first polyimide film 140 may be formed on the passivation film 130. The first polyimide film 140 may protect the elements from a variety of chemicals (e.g., alpha particles, radiation, high temperature, friction, etc.) that may not be blocked by the passivation film 130.

The first polyimide film 140 may be formed of a photosensitive polyimide or a non-photosensitive polyimide. The total thickness of the passivation film 130 and the first polyimide film 140 may be approximately 10 µm or more and may be varied within example embodiments.

A metal pad film 160 may be formed in the passivation film 130 and the first polyimide film 140.

Inductors 150 within the inductor-forming region I may be formed in the passivation film 130 and the first polyimide film 140, and therefore, may cause an increase in the total thickness of the passivation film 130 and the first polyimide film 140 in comparison to conventional semiconductor devices. According to this configuration, the resistance of the inductors may be reduced. As such, the Q factor may be increased and the performance may be improved.

The inductor 150 may be formed of at least one metal selected from a group including copper, aluminum, and an alloy. Copper or a copper alloy may be advantageous in regards to resistance.

The terminal region 153 of the inductor 150 may be connected to the uppermost wiring layer Mn located under the terminal region 153. Further, effects from the environment of the upper portion of the inductor 150 may be reduced by being covered with a second polyimide film 180.

The metal pad film 160 formed within the pad-forming region II may be an area for wire bonding of a semiconductor chip, and a bonding pad 170 may be formed on the metal pad film 160 for wire bonding.

In this configuration, the inductor 150 and metal pad film 160 may be formed of a metal (e.g., copper or aluminum). A barrier film B may be formed on the inner wall of the passivation film 130 and the first polyimide film 140 where the inductor 150 and the metal pad film 160 may be formed. In addition, a seed layer may be formed on the inner wall (not shown in FIG. 1).

The second polyimide film 180 may cover the inductors 150, and may expose the upper surface of the metal pad film 160 and/or the bonding pad 170 for a packaging process including the wire bonding. Similar to the first polyimide film 140, the second polyimide film 180 may be formed of a photosensitive or a non-photosensitive polyimide.

In the semiconductor device according to example embodiments, inductors may be formed in the passivation film and the polyimide film, which function as an element-protecting film. As such, a desired thickness of the inductors may be obtained. Accordingly, the resistance of the inductor may be reduced and the characteristics of the semiconductor device may be improved. In addition, the semiconductor elements may be protected from the environment by layering the passivation film 130 and polyimide films 140 and 180, and therefore, the reliability of the semiconductor device may be improved.

Figure 2:
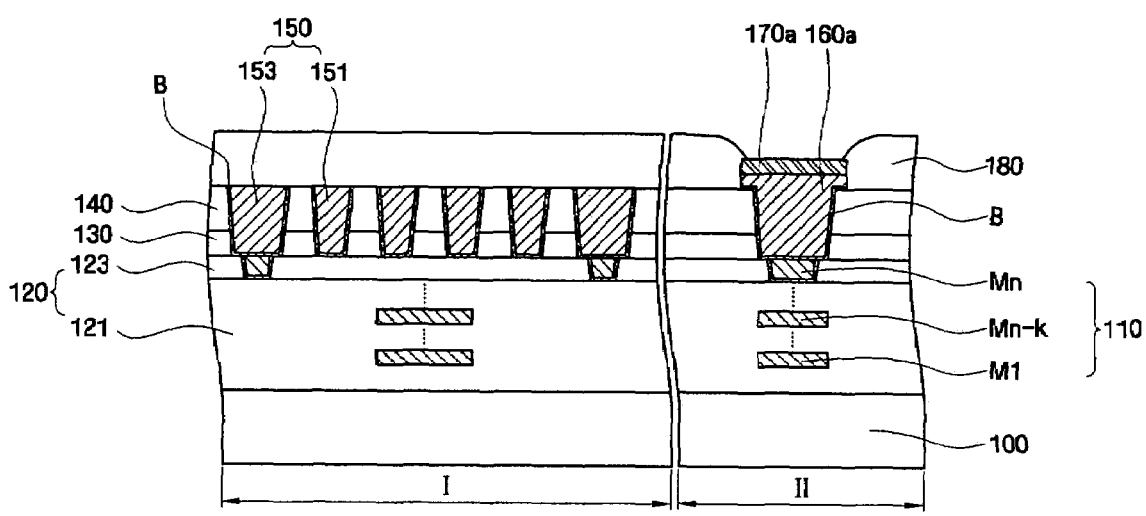
Figure 3:
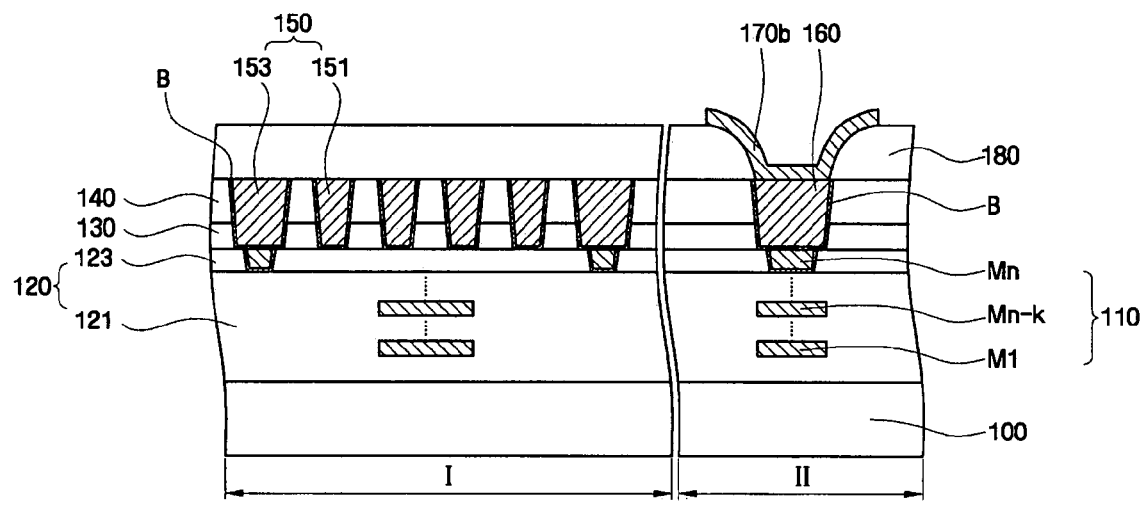

FIGS. 2 and 3 illustrate the cross-section of a semiconductor device according to example embodiments. In the following description, the components of FIGS. 2 and 3 are similar to those referred to in FIG. 1, and therefore, only the differences are mainly described.

Referring to FIG. 2, the upper surface of a metal pad film 160a may be higher than that of inductors 150, which may depend on a process separating nodes of the inductor 150 (as later described).

Referring to FIG. 3, a second polyimide film 180 exposing the metal pad film 160 and a bonding pad 170b may be formed. The bonding pad 170b may be formed on the metal pad film 160 and may cover the sidewall of the second polyimide film 180.

A method of manufacturing the semiconductor device illustrated in FIG. 1 is described below with reference to FIGS. 4A to 4E. In the following description, the components of FIGS. 4A to 4E are similar to those referred to in FIG. 1, and therefore, are not described.

Figure 4A:
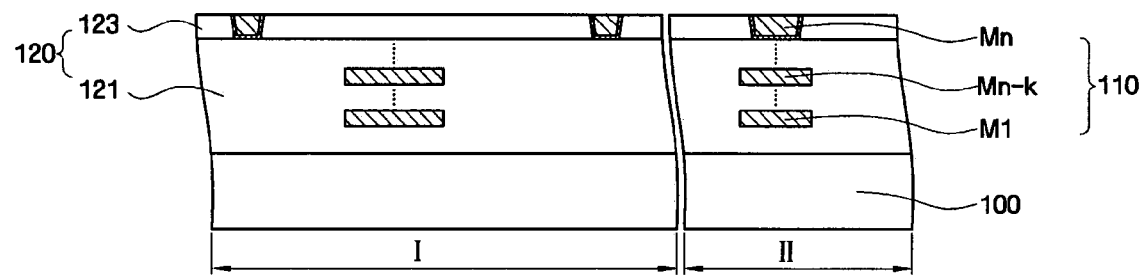
FIGS. 4A to 4E are cross-sectional views sequentially illustrating a manufacturing process of the semiconductor device illustrated in FIG. 1.

Referring to FIG. 4A, the multilayered wiring structure 110 may be formed on a semiconductor substrate 100.

The multilayered wiring structure 110 (not shown in the figure) may be connected to predetermined or given active elements (not shown) and passive elements (not shown) formed on the semiconductor substrate, and may be formed in or on a plurality of interlayer insulating films. 'Mn' in the figures represents the uppermost wiring layer and the reference numeral 123 represents the uppermost interlayer insulating film in which the uppermost wiring layer may be formed.

Figure 4B:
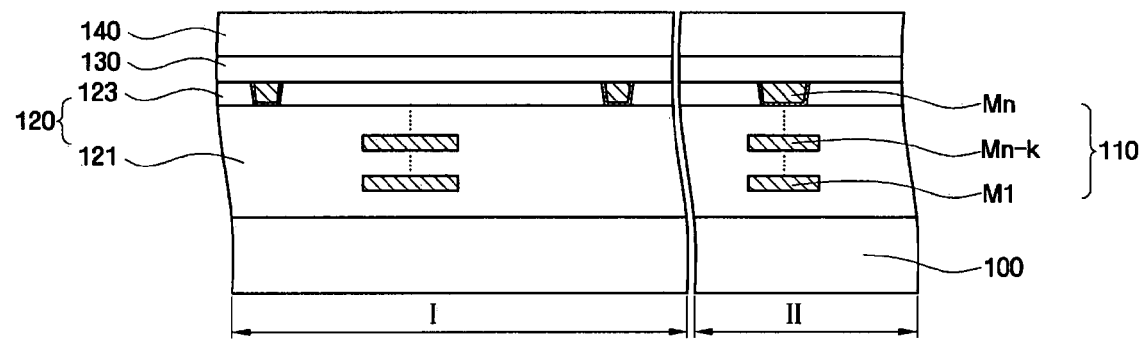

The passivation film 130 and the first polyimide film 140 covering the uppermost wiring layer Mn may be sequentially formed as illustrated in FIG. 4B.

The passivation film 130 may be formed, for example, by typical depositing (e.g., CVD, PECVD, and PVD).

The polyimide film 140 may be formed by a process well known in the art, for example, a spin coating process using a spin coater. Thus, in comparison to the passivation film or the uppermost wiring layer that may be formed by depositing, the polyimide film 140 may have sufficient thickness.

In the above processes, the polyimide film may decrease in thickness after the post hardening process, and therefore, the final thickness should be considered. The first polyimide film 140 may be layered on the passivation film 130 to a final thickness of more than, but not limited to, approximately 10 μm.

Figure 4C:
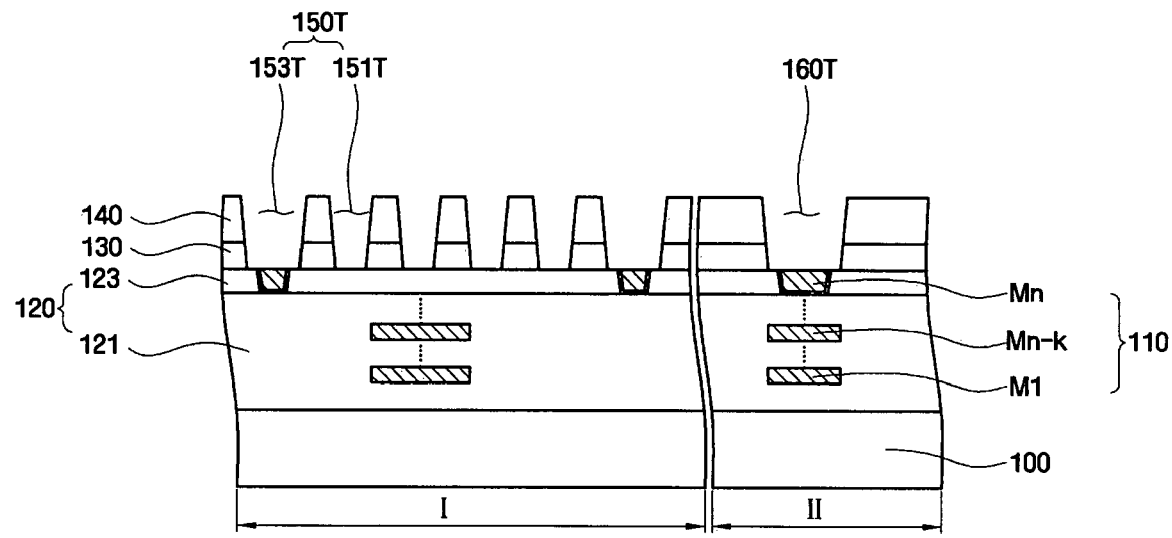

As illustrated in FIG. 4C, a trench region 150T, for forming inductors, and a trench region, for forming pads, may be formed in the first polyimide film 140 and passivation film 130 by sequentially patterning the first polyimide film 140 and passivation film 130. In this process, the trench region 150T, for forming inductors, may expose the upper surface of the uppermost interlayer insulating film 123 located under the passivation layer 130. The trench region 153T, where the terminals of the inductor may be formed, may expose the upper surface of the uppermost wiring layer Mn.

When the first polyimide film 140 is a photosensitive polyimide film, the first polyimide film 140 may be patterned via development (e.g., exposure of the first polyimide film 140) without a special photoresist pattern. The trench region 150T, for forming inductors, and the trench region 160T, for forming pads, may be then completed by patterning the passivation film 130 using the patterned first polyimide film as a mask film. Accordingly, because a process forming the photoresist pattern may not be required when the photosensitive polyimide is used, advantages of the involved processes may be obtained. A hardening process of the patterned first polyimide film may be added thereafter.

When the first polyimide film 140 is a non-photosensitive polyimide, the trench region, for forming inductors, and the trench region 160T, for forming pads, may be formed by forming a photoresist pattern (not shown) on the first polyimide film 140 and sequentially patterning the first polyimide film 140 and passivation film 130 using the photoresist pattern as an etching mask. A hardening process of the first polyimide film 140 may be added before forming the photoresist pattern.

Figure 4D:
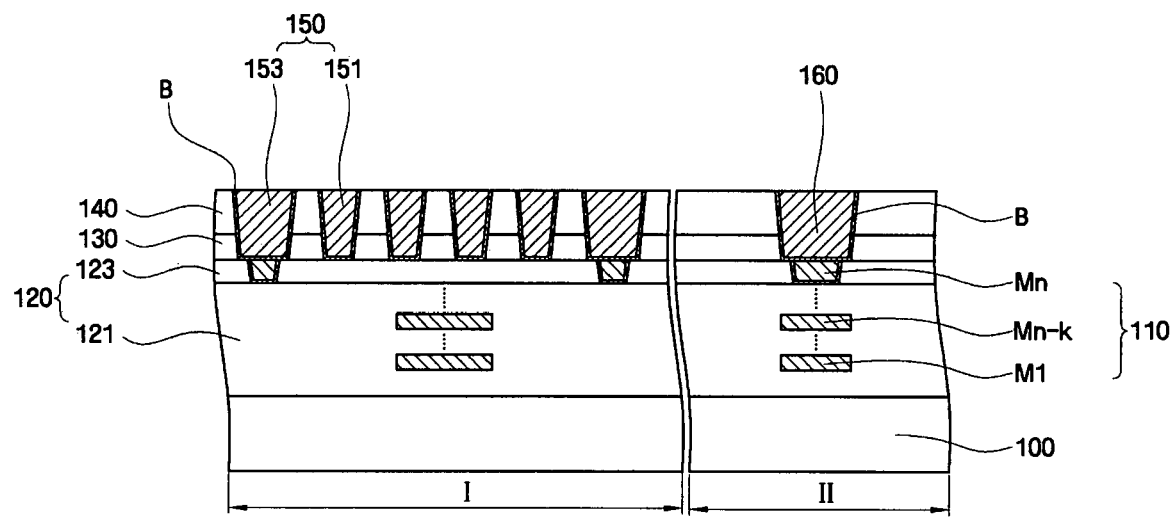

As illustrated in FIG. 4D, the inductor 150 and the metal pad film 160 may be formed by filling each of the trench regions.

The inductor 150 and the metal pad film 160, which may have an upper surface of the same height as the first polyimide film 140, may be completed by forming a barrier film B inside each trench region (referring to 150T and 160T in FIG. 4C), and forming and planarizing the metal layer.

The inductor 150 and the metal pad layer 160 may be completed by forming the seed layer (not shown) on the upper surface of the barrier film B, and forming the metal layer by electroplating and planarizing the metal layer.

Figure 4E:
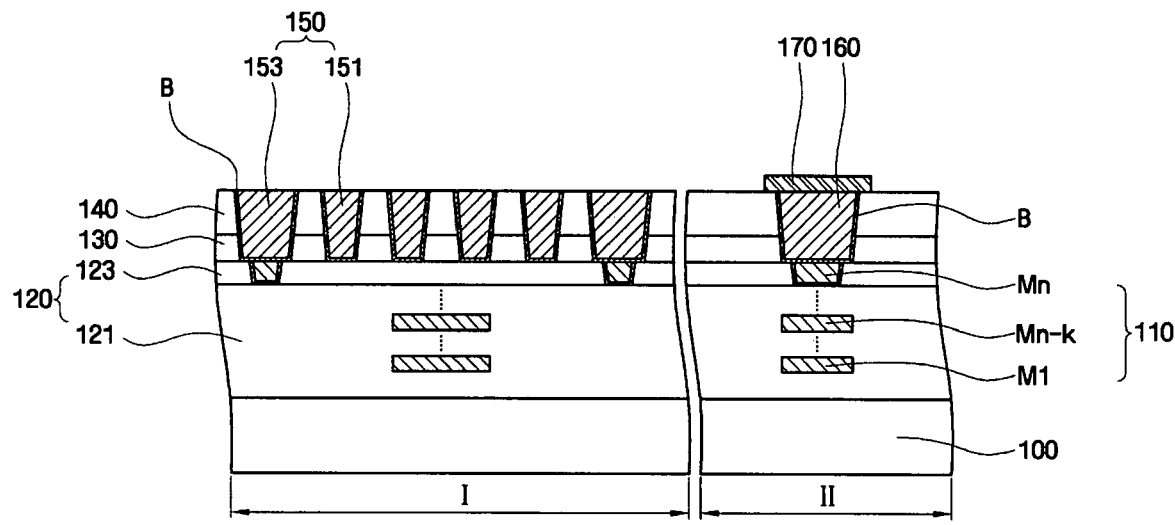

As illustrated in FIG. 4E, the bonding pad 170 may be formed on the upper surface of the metal pad film 160.

The manufacturing of the semiconductor device illustrated in FIG. 1 is completed after forming the second polyimide film 180 covering the inductor 150 and exposing the upper surface of the bonding pad 170.

The second polyimide film 180 may be formed utilizing the same method used in forming the first polyimide film 140. A special photoresist pattern used to form an opening to expose the bonding pad 170 may or may not be required, depending on whether a photosensitive or non-photosensitive polyimide is used.

A manufacturing method of the semiconductor device illustrated in FIG. 2 is described below with reference to FIGS. 5A and 5B. However, the processes up to the forming of the trench regions (for inductors and pads) in the passivation film and the first polyimide film are similar to those described in reference to FIGS. 4A to 4C, and thus, only the subsequent processes are described.

Figure 5A:
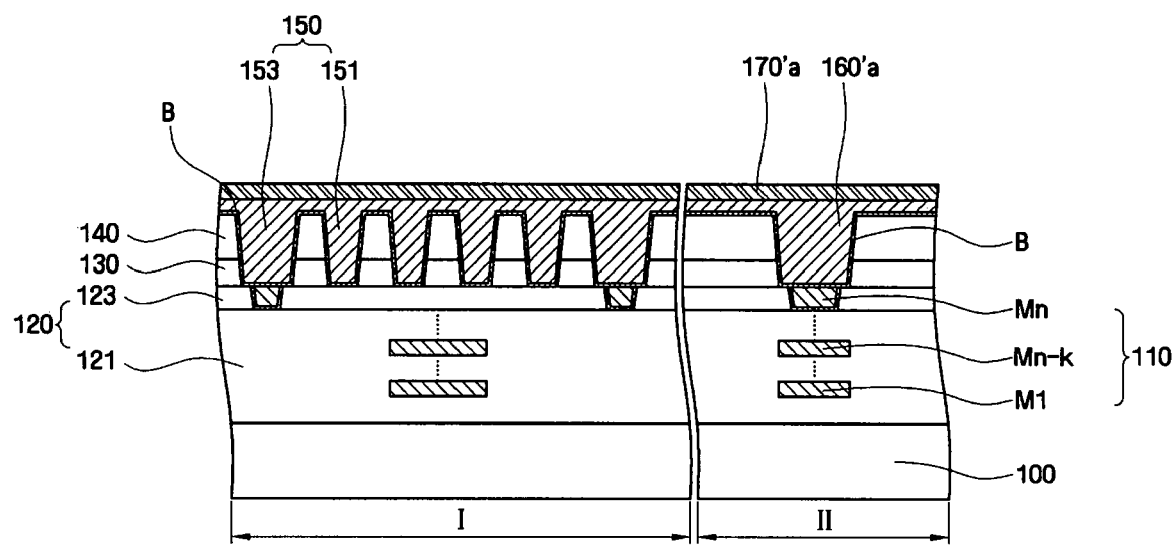
FIGS. 5A and 5B are cross-sectional views sequentially illustrating a manufacturing process of the semiconductor device illustrated in FIG. 2.

As illustrated in FIG. 5A, a first metal layer 160'a may be formed to fill the trench region for forming inductors (referring to 150T in FIG. 4C) and the trench region for forming pads (160T in FIG. 4C). A second metal layer 170'a may be formed on the first metal layer 160'a.

Figure 5B:
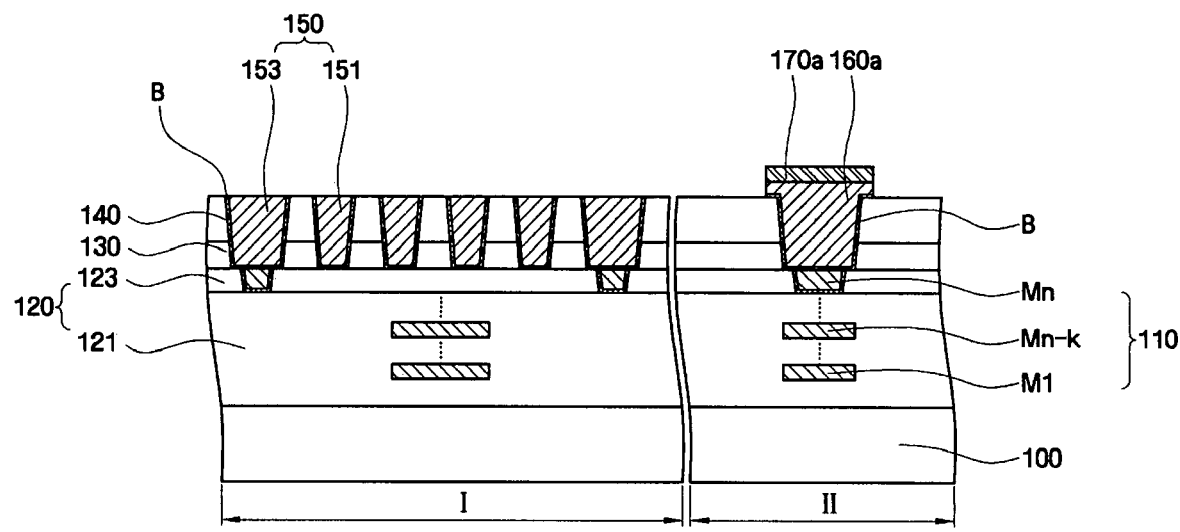

As illustrated in FIG. 5B, only the second metal layer 170a may remain within the pad-forming region II after patterning and each node may be separated in the inductor-forming region I. Through this process, the metal pad film 160a, on which the bonding pad 170a may be formed, and the inductor may be formed.

The manufacturing of the semiconductor device may be completed by forming a second polyimide film 180 covering the upper surface of the inductor 150 and exposing the bonding pad 170a.

A method of manufacturing the semiconductor device illustrated in FIG. 3 is described below in reference to FIG. 6. However, the processes up to the forming of the trench regions (for inductors and pads) in the passivation film and the first polyimide film are similar to those described in reference to FIGS. 4A to 4C, and thus, only the subsequent processes are described.

Figure 6:
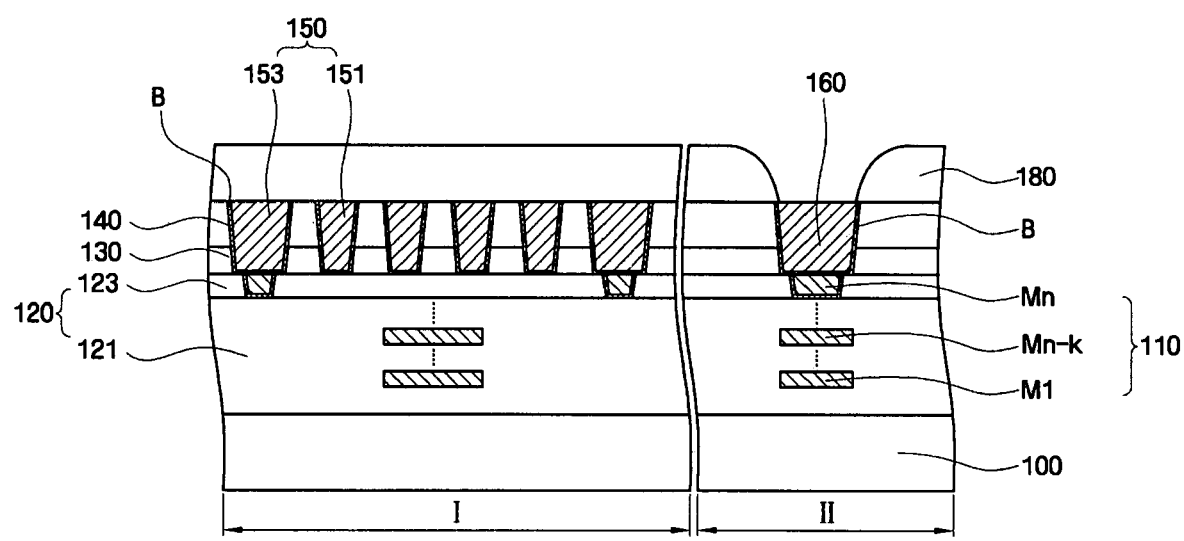

FIG. 6 illustrates the second polyimide film 180 covering the upper surface of the inductor 150 and the upper surface of the metal pad film 160 being exposed.

The manufacturing of the semiconductor device may be completed by forming a bonding pad connecting to the exposed upper surface of the metal pad film 160 and covering the sidewall of the second polyimide film 180.

Because an inductor with sufficient thickness may be formed in the passivation film and the polyimide film, which may be formed on the upper wiring layer, a semiconductor device having improved characteristics may be achieved. Further, advantages in the manufacturing process may be obtained because the process of forming a photoresist pattern may not be required by forming a photosensitive polyimide film of a passivation film. In addition, because semiconductor elements may be protected from the environment by layering a passivation film and a polyimide film, the reliability of the semiconductor device may be improved.

The foregoing is illustrative of example embodiments and is not to be construed as limiting thereof. Although example embodiments have been described, those skilled in the art will readily appreciate that many modifications are possible in example embodiments without materially departing from the novel teachings and advantages of example embodiments. Accordingly, all such modifications are intended to be included within the scope of the claims. In the claims, means-plus-function clauses are intended to cover the structures described herein as performing the recited function, and not only structural equivalents but also equivalent structures. Therefore, it is to be understood that the foregoing is illustrative of example embodiments and is not to be construed as limited to the specific embodiments disclosed, and that modifications to the disclosed embodiments, as well as other embodiments, are intended to be included within the scope of the appended claims. Example embodiments are defined by the following claims, with equivalents of the claims to be included therein.

What is claimed is:

1. A semiconductor device comprising:
   a semiconductor substrate;
   a multilayered wiring structure on the semiconductor substrate;
   a passivation film covering the uppermost wiring layer of the multilayered wiring structure;
   a first polyimide film on the passivation film; and
   inductors in the passivation film and the first polyimide film, the passivation film and the first polyimide film complementing each other in protecting the inductors and the multilayered wiring structure.

2. The semiconductor device of claim 1, further comprising a second polyimide film covering the inductors.

3. The semiconductor device of claim 1, wherein the total thickness of the passivation film and the first polyimide film is approximately 10 μm.

4. The semiconductor device of claim 1, further comprising a metal pad film in the passivation film and the first polyimide film.

5. The semiconductor device of claim 4, further comprising a bonding pad on the upper surface of the metal pad film.

6. The semiconductor device of claim 5, further comprising a second polyimide film covering the inductors and exposing the bonding pad.

7. The semiconductor device of claim 4, further comprising:
   a second polyimide film covering the inductors and exposing the metal pad film; and
   a bonding pad on the exposed metal pad film.

8. The semiconductor device of claim 5, further comprising a second polyimide film exposing the metal pad film and the bonding pad, wherein the bonding pad covers the sidewall of the second polyimide film.

9. The semiconductor device of claim 1, wherein terminal regions of the inductors are connected to the uppermost wiring layer formed under the inductors.

10. The semiconductor device of claim 1, further comprising a metal pad film having an upper surface higher than the upper surface of the inductors.

11. The semiconductor device of claim 1, wherein the first polyimide film is a photosensitive polyimide film.

12. The semiconductor device of claim 2, wherein the second polyimide film is a photosensitive polyimide film.

13. The semiconductor device of claim 1, wherein the passivation film is selected from the group consisting of a silicon oxide, a silicon nitride, a silicon oxynitride, a phosphor silicate glass, a polyimide, and combinations thereof.

14. The semiconductor device of claim 1, wherein the inductors and a metal pad film are formed at a same level.

* * * * *